US006815715B2

United States Patent
Wu et al.

(10) Patent No.: US 6,815,715 B2
(45) Date of Patent: Nov. 9, 2004

(54) STORAGE CAPACITOR STRUCTURE AND LIQUID CRYSTAL DISPLAY DEVICE HAVING THE SAME

(75) Inventors: Yuan-Liang Wu, Tainan Hsien (TW); Tong-Jung Wang, Tainan Hsien (TW); Chin-Jung Kuo, Kaohsiung Hsien (TW)

(73) Assignee: Chi Mei Optoelectronics Corporation, Tainan County (TW)

( * ) Notice: Subject to any disclaimer, the term of this patent is extended or adjusted under 35 U.S.C. 154(b) by 0 days.

(21) Appl. No.: 10/065,380

(22) Filed: Oct. 10, 2002

(65) Prior Publication Data

US 2003/0080368 A1 May 1, 2003

(51) Int. Cl.[7] .................................................. H01L 29/04
(52) U.S. Cl. .................... 257/59; 257/304; 257/306; 257/347; 349/38; 349/42; 349/43
(58) Field of Search .......................... 257/59, 304, 306, 257/347; 349/38, 42, 43, 138, 158

(56) References Cited

U.S. PATENT DOCUMENTS 6,356,318 B1 * 3/2002 Kawahata ................... 349/38
2002/0093016 A1 * 7/2002 Lim et al. ..................... 257/59

* cited by examiner

Primary Examiner—David Nelms
Assistant Examiner—Long Tran
(74) Attorney, Agent, or Firm—J.C. Patents

(57) ABSTRACT

A storage capacitor structure comprising a first capacitor electrode on a substrate, a capacitor dielectric layer on the first capacitor electrode and a second capacitor electrode on the capacitor dielectric layer, a passivation layer on the second capacitor electrode and a pixel electrode layer on the passivation layer. The second capacitor electrode has an area smaller than the first capacitor electrode. The passivation layer has an opening that exposes a portion of the second capacitor electrode. The pixel electrode layer and the second capacitor electrode are electrically connected through the opening in the passivation layer.

10 Claims, 3 Drawing Sheets

STORAGE CAPACITOR STRUCTURE AND LIQUID CRYSTAL DISPLAY DEVICE HAVING THE SAME

CROSS REFERENCE TO RELATED APPLICATIONS

This application claims the priority benefit of Taiwan application serial no. 90127127, filed Nov. 1, 2001.

BACKGROUND OF INVENTION

1. Field of Invention

The present invention relates to a display device. More particularly, the present invention relates to a storage capacitor structure.

2. Description of Related Art

Display devices have found widespread usage in our daily life. Television and computer monitors are common display devices that show different kinds of images or motions on a screen. Formerly, cathode ray tubes were widely used. However, due to bulkiness and power consumption, cathode ray tubes cannot be used for portable equipment such as a notebook computer. Nowadays, consumers welcome the newly developed dot matrix type of flat panel displays such as liquid crystal display (LCD) or thin film transistor (TFT) LCD. An array of picture pieces or pixels on the TFT LCD constitutes an image with the switching of each pixel controlled by a thin film transistor.

FIG. 1 is a schematic diagram showing the driving circuit of a conventional thin film transistor liquid crystal display. The TFT LCD requires a scan circuit 100 and a signal-holding circuit 102. The scan circuit 100 drives a group of scan lines 110 and the signal-holding circuit 102 drives a group of signal lines 112. The scan lines 110 and the signal lines 112 cross each other perpendicularly forming a two-dimensional array. Each cross-point in the two-dimensional array has a thin film transistor 104, a storage capacitor 108 and a liquid crystal display (LCD) cell 106. The thin film transistor 104, the storage capacitor 108 and the LCD cell 106 together constitute a pixel. The gate terminal of the thin film transistor 104 is controlled by the corresponding scan line 110 and the source terminal of the thin film transistor 104 is controlled by the corresponding signal line 112. The drain terminal of the thin film transistor 104 is connected to a pixel electrode layer and an electrode of the storage capacitor 108. The storage capacitor 108 maintains a voltage for controlling the liquid crystal. Another electrode of the storage capacitor 108 is connected to an adjacent scan line.

Following the gradual reduction in dimensional layout of a thin film transistor, a common electrode type of storage capacitor design is selected for reducing the effect of gate-driven delay. In this design, the common electrode and the gate terminal are separated from each other so that the other terminal of the capacitor receives a common voltage such as a common electrode voltage (Vcom).

FIG. 2 is a schematic diagram showing the layout of a unit cell of a conventional thin film transistor liquid crystal display. As shown in FIG. 2, the gate terminal of the thin film transistor 104(g) is connected to the scan line 110. The source terminal of the thin film transistor 104(s) is connected to the corresponding signal line 1112. The drain terminal of the thin film transistor 104(d) is connected to a pixel electrode layer 118. A common lower electrode 114 and an upper electrode 116 together constitute a storage capacitor. The pixel electrode layer 118 and the upper electrode 116 are linked through an opening 120.

The lower electrode 114 is formed on a transparent substrate. The lower electrode 114 made of a first metallic layer is patterned together with the gate terminal of the thin film transistor 104. A capacitor dielectric layer is formed on the lower electrode 114. A metallic electrode layer 116 made of a second metallic layer is formed on the capacitor dielectric layer to serve as an upper electrode for the storage capacitor. The overlapping region between the upper electrode 116 and the lower electrode 114 is the main charge storage area for the capacitor. A passivation layer is formed on the upper electrode 116 and surrounding areas. The passivation layer has an opening 120 that exposes a portion of the upper electrode 116. A pixel electrode layer 118 is electrically connected to the upper electrode 116 through the opening 120. Finally, other structural components of a liquid crystal display such as a color filter panel is assembled with the transparent substrate and a liquid crystal (not shown) is injected therein to form a liquid crystal display.

In the aforementioned LCD structure, the channel regions of most thin film transistors 104 are made using amorphous silicon (Si:H). During the patterning operation, some conductive residual material such as unwanted amorphous silicon material 115 may deposit along the edges of the capacitor lower electrode 114 and accumulate above the capacitor dielectric layer 124. Hence, in the fabrication of the so-called second metallic layer for forming the capacitor upper electrode 116 and the signal lines 112, the upper electrode 116 will cover and cross over the edges of the lower capacitor electrode 114 of the capacitor. If some of the conductive residual material 115 is retained on the capacitor dielectric layer 124, a short circuit between the capacitor upper electrode 116, the signal line 112 and the pixel electrode 118 will occur leading to pixel defects in the LCD array.

The presence of conductive residual material 115 may also lead to a short circuit between the upper and the lower capacitor electrode causing the storage capacitor 108 to malfunction. The conductive residual material 115 may be removed by shining a laser beam and burning out the material. However, the process may also break the normal line connection with the common electrode 114 and lead to a shallow line for the gate terminal. To prevent the formation of shallow lines, the defective capacitor is frequently not repaired so that the defective bright spot remains on the LCD.

Nevertheless, stringent demand for high quality image in the market is a major force for the use of laser to repair bright spot and attain a zero bright spot target. At present, laser repair technique has not progressed far enough for spot darkening to be carried out as routine. This is because the common electrode and the gate terminal may form a short circuit after the repair and result in a bright line defect. Thus, a method capable of repairing storage capacitor point defect and at the same time permitting the execution of spot darkening operations is needed for improving image quality.

SUMMARY OF INVENTION

Accordingly, one object of the present invention is to provide a storage capacitor structure having a capacitor lower electrode larger than a corresponding capacitor upper electrode achieved by shrinking the edges of the upper electrode. Due to non-overlapping of the capacitor upper electrode with the edges of the capacitor lower electrode, the probability of short circuiting between the capacitor and a nearby signal line in the presence of conductive residual material is greatly reduced.

To achieve these and other advantages and in accordance with the purpose of the invention, as embodied and broadly described herein, the invention provides a storage capacitor structure. The capacitor structure includes a first capacitor electrode on a substrate, a capacitor dielectric layer on the first capacitor electrode and a second capacitor electrode on the capacitor dielectric layer. The second capacitor electrode has a surface area smaller than the first capacitor electrode. A passivation layer is formed on the second capacitor electrode. The passivation layer has an opening that exposes a portion of the second capacitor electrode. A pixel electrode layer is formed on the passivation layer. The pixel electrode layer and the second capacitor electrode are connected through the opening in the passivation layer.

In the aforementioned capacitor structure, the pixel electrode is connected to a switching element. With the second capacitor electrode having a surface area smaller than the first capacitor electrode, the edges of the first capacitor electrode do not overlap with that of the second capacitor electrode and hence the probability of having a short-circuiting capacitor is greatly reduced.

This invention also provides a liquid crystal display device. The liquid crystal display device includes a plurality of scan lines, a plurality of signal lines and a plurality of pixels. Each pixel comprises a liquid crystal cell having a pixel electrode connected to a storage capacitor and a switching element connected between the liquid crystal cell and one of the signal lines. The switching element is connected to a gate terminal of a corresponding scan line. The storage capacitor further includes a first capacitor electrode, a capacitor dielectric layer and a second capacitor electrode. An overlapping region between the second capacitor electrode and the first capacitor electrode is substantially identical to the surface area of the second capacitor electrode.

This invention also provides a method of forming a storage capacitor that includes forming a first capacitor electrode on a substrate. A first capacitor dielectric layer is formed on the first capacitor electrode and then a second capacitor electrode is formed on the capacitor dielectric layer. The second capacitor electrode has a surface area smaller than the first capacitor electrode. A passivation layer is formed on the second capacitor electrode. The passivation layer is patterned to form an opening that exposes a portion of the second capacitor electrode. A pixel electrode layer is formed on the passivation layer. The pixel electrode layer and the second capacitor electrode are connected through the opening in the passivation layer.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
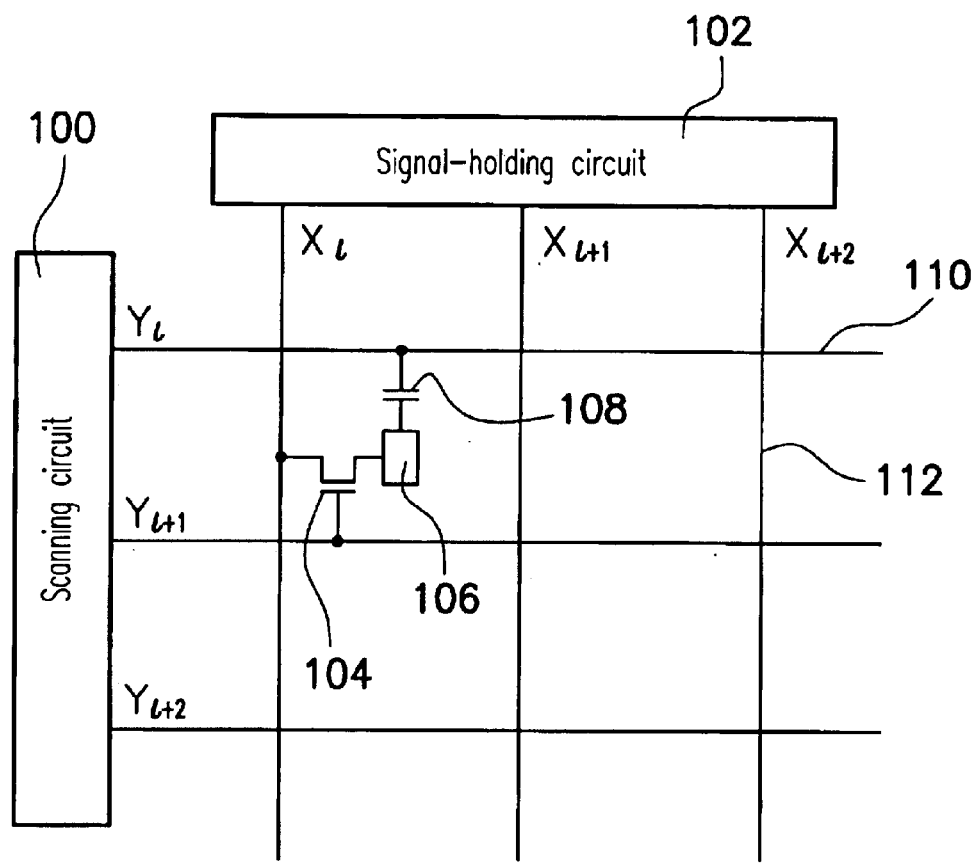
FIG. 1 is a schematic diagram showing the driving circuit of a conventional thin film transistor liquid crystal display.

Reference will now be made in detail to the present preferred embodiments of the invention, examples of which are illustrated in the accompanying drawings. Wherever possible, the same reference numbers are used in the drawings and the description to refer to the same or like parts.

One major aspect of the storage capacitor structure according to this invention is in the production of a capacitor lower electrode with a surface area greater than the capacitor upper electrode by shrinking the edges of the upper electrode or enlarging the edges of the capacitor lower electrode. Since the capacitor upper electrode has no overlapping with the edges of the lower electrode, probability of having a short-circuiting between the capacitor, a nearby signal line and the pixel electrode is greatly reduced even if conductive conductive residual material are trapped on the dielectric layer along the edges of the lower electrode. The following is a description of an embodiment of this invention.

Figure 3A:
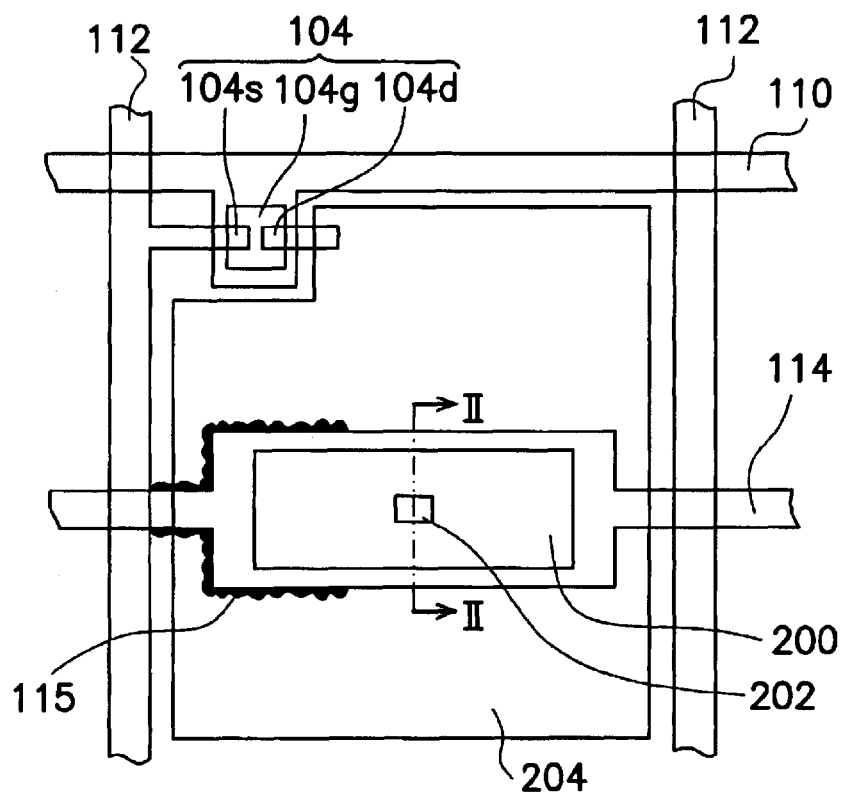
FIG. 3A is a schematic diagram showing the layout of a unit cell in a thin film transistor liquid crystal display according to one preferred embodiment of this invention.

FIG. 3A is a schematic diagram showing the layout of a unit cell in a thin film transistor liquid crystal display according to one preferred embodiment of this invention. As shown in FIG. 3A, the gate terminal of a thin film transistor 104 is connected to a scan line 110. The thin film transistor 104 has a gate terminal 104g, a source terminal 104s and a drain terminal 104d. In general, there are two types of thin film transistor 104 design. One type of thin film transistor has a gate terminal 104g formed underneath a corresponding source terminal 104s and a drain terminal 104d. On the other hand, the other type of thin film transistor has a gate terminal 104g formed above a corresponding source terminal 104s and a drain terminal 104d. For the former type of thin film transistor, the gate terminal 104g is formed on the transparent substrate first. Typically, the gate terminal 104g and the capacitor lower electrode 114 are patterned together in a first metallic layer fabrication. Furthermore, there is a channel region 104a between the source terminal 104s and the drain terminal 104d. The channel region 104a is mostly made from an amorphous silicon material. Patterning an N-doped amorphous silicon conductive material and a second metallic layer formed thereon forms the source terminal 104s and the drain terminal 104d. Most liquid crystal display devices further include an upper and a lower pixel electrode and a liquid crystal layer between them. Other associated elements such as color filter, retardation film, and polarizer should be familiar to those skilled in the art, detail description of their fabrication is omitted here. The following is a more detailed description of the controlling mechanism of the liquid crystal display device.

As shown in FIG. 3A, the gate terminal 104g of the thin film transistor 104 and the scan line 110 are connected so that the scan circuit 100 controls the scan line 110. Similarly, the source terminal 104s is connected to the corresponding signal line 112 so that the signal-holding circuit 102 controls the signal line 112. The drain terminal 104d of the thin film transistor 104 is connected to a pixel electrode layer 204. In addition, the capacitor lower electrode 114 and the capacitor upper electrode 200 together constitute a storage capacitor. The capacitor lower electrode 114 is connected to a common electrode Vcom, for example. The pixel electrode 204 and the capacitor upper electrode 200 are connected through an opening 202. In general, the pixel electrode layer 204 is an indium-tin-oxide layer, for example.

Referring to FIG. 1, the scan circuit 100 and the signal-holding circuit 102 feed different sequential clocking signals to the scan lines 110 and the signal line 112 respectively. The scan line 110 controls the opening and closing of the thin film transistor 102. The signal line 112 provides a voltage to the thin film transistor 104. The drain terminal 104d of the thin film transistor 104 and the storage capacitor 108 are connected. If the thin film transistor 104 is switched on, necessary voltage is sent to the storage capacitor 108 through the signal line 112 and voltage at the pixel electrode ITO is controlled. According to the applied voltage to the upper and lower pixel electrodes ITO, orientation of liquid crystal molecules within the pixel area is controlled. After the storage capacitor is charged through the thin film transistor 104, brightness level of the pixel can be selectively controlled and maintained.

Figure 2:
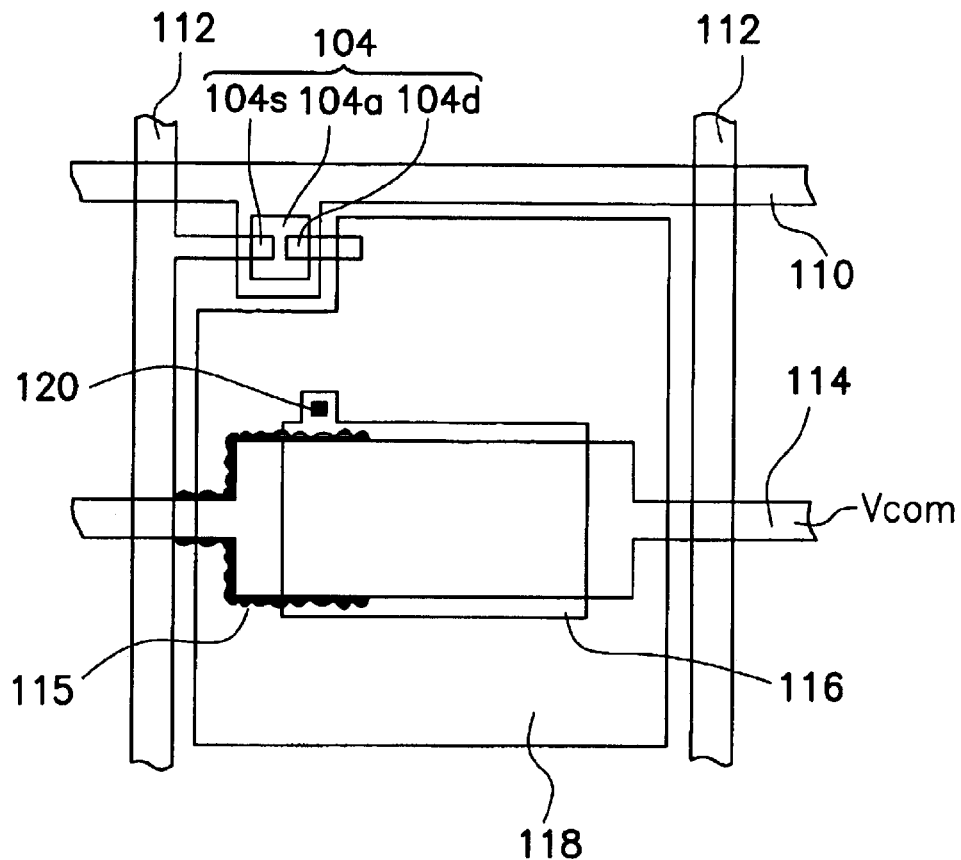
FIG. 2 is a schematic diagram showing the layout of a unit cell of a conventional thin film transistor liquid crystal display.

Because the fabrication of a pixel array involves at least four major steps, some conductive residual material may be retained leading to possible defects such as the problems described with reference to FIG. 2. Unwanted short-circuiting due to the presence of conductive residual material may be removed by redesigning the capacitor upper electrode according to this invention.

In this invention, the capacitor upper electrode 200 is designed to cover an area smaller than the capacitor lower electrode 114 so that the edges of the capacitor lower electrode 114 do not overlap with that of the capacitor upper electrode 200. In other words, the overlapping region between the capacitor upper electrode 200 and the capacitor lower electrode 114 has an area substantially equal to the area of the upper capacitor electrode 200. The edges of the lower electrode 114 are particularly vulnerable to the deposition of conductive residual material 115 during capacitor fabrication. In general, the conductive residual material 115 is a conductive residue such as leftover amorphous silicon when the channel region 104a is formed. The conductive residue is usually deposited on the capacitor dielectric layer 124 along the edges of the capacitor lower electrode 114. The capacitor upper electrode 200 and the signal line 112 are generally formed together in the same process. Hence, the presence of conductive residual material 115 may lead to a short circuit between the capacitor upper electrode 200 and the signal line 112 if there is overlapping between the upper electrode 200 and the edges of the lower electrode 114.

In addition, if the conductive residual material 115 contacts with both the capacitor upper electrode 200 and the capacitor lower electrode 114, the capacitor may malfunction. Since the area of the upper capacitor electrode 200 is made smaller than the lower capacitor electrode 114 according to the invention, short-circuiting of the capacitor or short-circuiting between the pixel electrode layer 204 and the signal line can be prevented.

The capacitor upper electrode 200 occupies an area smaller than the capacitor lower electrode 114. Hence, there is no overlapping between the upper electrode 200 and the edges of the lower electrode 114. Even if some conductive residual material 115 adheres to the edges of the lower electrode 114, the material 115 will not form direct contact with the upper electrode 200 leading to an unwanted short circuit. For example, if the conductive residual material 115 extends to the signal line 112, the upper electrode 200 and the signal line 112 will short-circuit whenever the upper electrode 200 and the conductive residual material 115 are in contact.

The thin film transistor 104 mainly serves as a switching element for controlling the charging state of the capacitor. The opening 202 is formed by a conventional patterning operation such as photolithographic and etching process. Since the opening 202 is an area for connecting up the pixel electrode and the upper electrode 200, the opening 202 is typically located within the upper electrode 200 and close to the central portion of the upper electrode 200, for example.

Figure 3B:
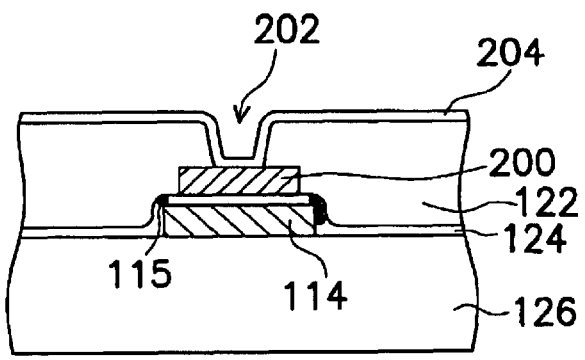
FIG. 3B is a diagram showing a cross-sectional view along line II—II of FIG. 3A.

One major characteristic of this invention is in the production of a capacitor upper electrode having a surface area smaller than a corresponding capacitor lower electrode so that conductive residual material 115 is prevented from contacting the upper electrode. FIG. 3B is a diagram showing a cross-sectional view along line II—II of FIG. 3A. As shown in FIGS. 3A and 3B, the capacitor lower electrode 114 is formed on the substrate 126. The capacitor dielectric layer 124 is formed on the capacitor lower electrode 114. The capacitor upper electrode 200 is formed on the capacitor dielectric layer 124. The capacitor lower electrode 114, the capacitor dielectric layer 124 and the capacitor upper electrode 200 together form a storage capacitor. The passivation layer 122 is formed on the capacitor upper electrode 200 and the substrate 126. The passivation layer 122 has an opening 202 that exposes a portion of the capacitor upper electrode 200. The pixel electrode layer 204 is formed on the passivation layer 122. The pixel electrode layer 204 and the capacitor upper electrode 200 are connected through the opening 202 in the passivation layer 122.

The capacitor upper electrode 200 occupies an area smaller than the capacitor lower electrode 144. Hence, there is no overlapping between the upper electrode 200 and the edges of the lower electrode 114. Even if some conductive residual material 115 adheres to the edges of the lower electrode 114, the material 115 will not form direct contact with the upper electrode 200 leading to an unwanted short circuit. For example, if the conductive residual material 115 extends to the signal line 112, the upper electrode 200 and the signal line 112 will short-circuit whenever the upper electrode 200 and the conductive residual material 115 are in contact.

In conclusion, one aspect of this invention is the design of a capacitor whose upper electrode does not overlap with the edges of its lower electrode. Due to the non-overlapping of the edges, unwanted short circuit is prevented. To provide sufficient capacitance, area occupied by the upper electrode may be reduced and area occupied by the lower electrode may be expanded. Furthermore, the shape of the edges may also be changed.

In other words, as long as there is no overlapping between the edges of the lower electrode with the upper electrode, area may be adjusted in whatever ways are deemed suitable to the design. Furthermore, this invention is applicable not only to a capacitor on common (Cs-on-common) electrode design but is equally applicable for a capacitor on gate (Cs-on-gate) design.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A unit cell in a liquid crystal display device, the unit cell comprising:

a first capacitor electrode on a substrate;

a capacitor dielectric layer on the first capacitor electrode, wherein the capacitor dielectric layer completely covers the first capacitor electrode and is in physical contact with the entire first capacitor electrode;

a second capacitor electrode on the capacitor dielectric layer, wherein the second capacitor electrode has a surface area smaller than the first capacitor electrode, to prevent overlapping with edges of the first capacitor electrode;

a passivation layer on the second capacitor electrode, wherein the passivation layer has an opening that exposes a portion of the second capacitor electrode; and a pixel electrode layer on the passivation layer such that the pixel electrode layer and the second capacitor electrode are electrically connected through the opening in the passivation layer.

2. The unit cell of claim 1, wherein an overlapping region between the first capacitor electrode and the second capacitor electrode is substantially equal to the surface area of the second capacitor electrode.

3. The unit cell of claim 1, wherein the pixel electrode is further connected to a switching element.

4. The unit cell of claim 1, wherein the pixel electrode is further connected to a thin film transistor.

5. The unit cell of claim 1, wherein the first capacitor electrode is further connected to a common voltage.

6. A storage capacitor structure in a unit cell of a liquid crystal display device, the storage capacitor structure comprising:

a first capacitor electrode on a substrate;

a capacitor dielectric layer on the substrate, wherein the capacitor dielectric layer completely covers the first capacitor electrode and is in physical contact with the entire first capacitor electrode; and a second capacitor electrode on the capacitor dielectric layer, wherein the edges of the second capacitor electrode are bounded within the edges of the first capacitor electrode.

7. The capacitor structure of claim 6, wherein when a residual conductive material is distributed along the edges of the first capacitor electrode, the residual conductive material will not come in contact with the edges of the second capacitor electrode so that an electrical short between the second capacitor electrode and a neighboring signal line can be prevented.

8. A liquid crystal display device, comprising:

a plurality of scan lines;

a plurality of signal lines; and a plurality of pixels each including a liquid crystal cell having a pixel electrode connected to a storage capacitor and a switching element connected between the liquid crystal cell and one of the signal lines, a gate of the switching element being connected to one of the scan lines;

wherein a first capacitor electrode, a capacitor dielectric layer and a second capacitor electrode together form the storage capacitor, and wherein the capacitor dielectric layer completely covers the first capacitor electrode and is in physical contact with the entire first capacitor electrode and an area of the second capacitor electrode is smaller than an area of the first capacitor electrode so that edges of the second electrode do not overlap with edges of the first capacitor electrode.

9. A storage capacitor for holding a voltage provided from a signal line of a liquid crystal device within a predetermined interval, the storage capacitor comprising:

a first capacitor electrode disposed on a substrate of the liquid crystal device; a capacitor dielectric layer on the substrate, wherein the capacitor dielectric layer completely covers the first capacitor electrode and is in physical contact with the entire first capacitor electrode;

a second capacitor electrode disposed substantially over the first capacitor electrode electrically connected to a pixel electrode;

wherein an area of the second capacitor electrode normally projected on the plane of the first capacitor electrode is substantially bounded within an area of the first capacitor electrode so as to prevent electrical short between the second capacitor electrode and the signal line.

10. A storage capacitor for holding a voltage provided from a signal line of a liquid crystal device within a predetermined interval, the storage capacitor comprising:

a first capacitor electrode disposed on a substrate of the liquid crystal device and having a first area with respect to a plan view of the first capacitor electrode;

a second capacitor electrode disposed substantially over the first capacitor electrode and having a second area with respect to a plan view of the second capacitor electrode; and dielectric means laminated between the first capacitor electrode and the second capacitor electrode, wherein the dielectric means comprises a capacitor dielectric layer that completely covers the first capacitor electrode and is in physical contact with the entire first capacitor electrode;

wherein the second area of the second capacitor electrode, with respect to the plan view thereof, is substantially within the first area of the first capacitor electrode.

* * * * *